(12) United States Patent
Labetski et al.

(10) Patent No.: US 9,013,679 B2
(45) Date of Patent: Apr. 21, 2015

(54) COLLECTOR MIRROR ASSEMBLY AND METHOD FOR PRODUCING EXTREME ULTRAVIOLET RADIATION

(75) Inventors: Dzmitry Labetski, Utrecht (NL); Erik Roelof Loopstra, Eindhoven (NL); Antonius Theodorus Wilhelmus Kempen, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 274 days.

(21) Appl. No.: 13/641,069

(22) PCT Filed: Mar. 18, 2011

(86) PCT No.: PCT/EP2011/054098
§ 371 (c)(1),
(2), (4) Date: Oct. 12, 2012

(87) PCT Pub. No.: WO2011/131431
PCT Pub. Date: Oct. 27, 2011

(65) Prior Publication Data
US 2013/0088697 A1    Apr. 11, 2013

Related U.S. Application Data

(60) Provisional application No. 61/360,089, filed on Jun. 30, 2010, provisional application No. 61/326,965, filed on Apr. 22, 2010.

(51) Int. Cl.
*G02B 5/08*     (2006.01)
*G03F 7/20*     (2006.01)
*G21K 5/04*     (2006.01)

(52) U.S. Cl.
CPC .............. *G02B 5/08* (2013.01); *G03F 7/70033* (2013.01); *G03F 7/70175* (2013.01);
(Continued)

(58) Field of Classification Search
CPC .............. G02B 5/08; G21K 5/04; G03F 7/20; G03F 7/70033; G03F 7/70166; G03F 7/70175; G03F 7/70808; G03F 7/70841; G03F 7/70883; G03F 7/70908; G03F 7/70916; G03F 7/70933
USPC ........... 250/504 R; 355/67, 77; 359/359, 360, 359/509, 838
See application file for complete search history.

(56) References Cited

U.S. PATENT DOCUMENTS

2005/0199829 A1    9/2005    Partlo et al.
2006/0219959 A1    10/2006   Hergenhan et al.
(Continued)

FOREIGN PATENT DOCUMENTS

CN    101218543 A       7/2008
JP    2012169580 A  *   9/2012
(Continued)

OTHER PUBLICATIONS

International Preliminary Report on Patentability and Written Opinion mailed Nov. 1, 2012 in corresponding International Patent Application No. PCT/EP2011/054098.
(Continued)

*Primary Examiner* — Colin Kreutzer
(74) *Attorney, Agent, or Firm* — Pillsbury Winthrop Shaw Pittman LLP (57) ABSTRACT

A collector mirror assembly includes a collector mirror that includes a reflective surface and a hole having an edge. The hole extends through the reflective surface. The assembly also includes a tubular body having an inner surface and an outer surface. The tubular body is constructed and arranged to guide a gas flow in a direction substantially transverse to the reflective surface. The outer surface of the tubular body and the edge of the hole form an opening arranged to guide a further gas flow that diverges with respect the gas flow substantially transverse to the reflective surface.

16 Claims, 4 Drawing Sheets

(52) U.S. Cl.
CPC ....... *G03F 7/70808* (2013.01); *G03F 7/70841* (2013.01); *G03F 7/70908* (2013.01); *G03F 7/70916* (2013.01); *G03F 7/70933* (2013.01); *G03F 7/20* (2013.01); *G21K 5/04* (2013.01)

(56) References Cited

U.S. PATENT DOCUMENTS

| | | |
|---|---|---|
| 2008/0212044 A1 | 9/2008 | Derra et al. |
| 2009/0057567 A1 | 3/2009 | Bykanov et al. |
| 2009/0250639 A1 | 10/2009 | Banine et al. |
| 2012/0223257 A1* | 9/2012 | Nagai et al. ............... 250/504 R |

FOREIGN PATENT DOCUMENTS

| | | | |
|---|---|---|---|
| WO | 2009/025557 | 2/2009 | |
| WO | WO 2009024860 A2 * | 2/2009 | ............... H05G 2/00 |
| WO | 2010/017892 | 2/2010 | |

OTHER PUBLICATIONS

International Search Report mailed Aug. 3, 2011 in corresponding International Patent Application No. PCT/EP2011/054098.

* cited by examiner

COLLECTOR MIRROR ASSEMBLY AND METHOD FOR PRODUCING EXTREME ULTRAVIOLET RADIATION

CROSS-REFERENCE TO RELATED APPLICATIONS

This application is the US national phase application of PCT/EP2011/054098, filed Mar. 18, 2011, which claims the benefit of U.S. provisional application 61/326,965, filed on Apr. 22, 2010, and U.S. provisional application 61/360,089, filed on Jun. 30, 2010. Both of these provisional applications are hereby incorporated in their entirety by reference.

FIELD

The present invention relates to a collector mirror assembly for a lithographic apparatus and a method for producing extreme ultraviolet radiation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In addition to extreme ultraviolet radiation, the plasma generally produces debris in the form of particles, such as thermalized atoms, ions, neutrals, nanoclusters, and/or microparticles. The debris may cause damage to the collector mirror and other optics. In an attempt to prevent the debris from causing damage, a buffer gas may be used in the vicinity of the plasma in order to mitigate the debris. However, current methods and apparatus for providing the buffer gas are not satisfactory.

SUMMARY

It is desirable to provide at least a collector mirror assembly that obviates or mitigates at least one deficiency of the prior art, whether identified herein or elsewhere, or which provides an alternative to existing assemblies.

According to an aspect, there is provided a collector mirror assembly that includes a collector mirror having a reflective surface and a hole having an edge. The hole extends through the reflective surface. The assembly includes a tubular body that extends through the hole. The tubular body has an inner surface and an outer surface. The tubular body is constructed and arranged to guide a main gas flow in a direction substantially transverse to the reflective surface. The assembly also includes an opening between the outer surface of the tubular body and the edge of the hole. The opening is arranged to guide a further gas flow that diverges with respect to the main gas flow. The outer surface of the tubular body and the edge of the hole form an opening arranged to guide a further gas flow that diverges with respect the gas flow substantially transverse to the reflective surface.

The opening may be arranged to guide the further gas flow substantially along the reflective surface.

At least part of one or both of the inner surface and the outer surface of the tubular body may be tapered in a direction against the gas flow.

One or more walls (e.g. in the form of one or more additional tubular bodies) may be provided between the outer surface of the tubular body and the edge of the hole, the one or more walls being constructed and arranged to divide the further gas flow in one or more sub-flows.

The collector mirror may be constructed to focus radiation emitted from a first focal point to a second focal point.

The gas flow may be directed away from the reflective surface to one or both of the first focal point and the second focal point.

According to an aspect, there is provided a module constructed to produce extreme ultraviolet radiation, the module including a supply configured to supply one or more droplets of an ignition material to a predetermined target ignition position, a radiation source configured to supply a laser beam arranged to be focused on the predetermined target ignition position and to produce a plasma by hitting a droplet located at the predetermined target ignition position so as to change the droplet into an extreme ultraviolet producing plasma, and a collector mirror assembly comprising a collector mirror having a reflective surface and a hole having an edge. The hole extends through the reflective surface. The collector mirror assembly includes a tubular body that extends through the hole. The tubular body has an inner surface and an outer surface. The tubular body is constructed and arranged to guide a gas flow in a direction substantially transverse to the reflective surface. An opening is between the outer surface of the tubular body and the edge of the hole and is arranged to guide a further gas flow that diverges with respect to the main gas flow.

The collector mirror may be constructed to focus radiation emitted from a first focal point to a second focal point.

The main gas flow may be directed away from the reflective surface to one or both of the first focal point and the second focal point.

The target ignition position may be the first focal point.

According to an aspect of the invention, there is provided a lithographic projection apparatus arranged to project a pattern from a patterning device onto a substrate. The apparatus includes a collector mirror assembly that includes a collector mirror having a reflective surface and a hole having an edge. The hole extends through the reflective surface. The assembly includes a tubular body that extends through the hole. The tubular body has an inner surface and an outer surface. The tubular body is constructed and arranged to guide a main gas flow in a direction substantially transverse to the reflective surface. An opening is between the outer surface of the tubular body and the edge of the hole. The opening is arranged to guide a further gas flow that diverges with respect the main gas flow. The outer surface of the tubular body and the edge of the hole may form the opening arranged to guide the further gas flow.

According to an aspect of the invention, there is provided a lithographic projection apparatus arranged to project a pattern from a patterning device onto a substrate. The apparatus includes a module that includes a supply configured to supply one or more droplets of an ignition material to a predetermined target ignition position, a radiation source configured to supply a laser beam arranged to be focused on the predetermined target ignition position and to produce a plasma by hitting a droplet located at the predetermined target ignition position so as to change the droplet into an extreme ultraviolet producing plasma, and a collector mirror assembly that includes a collector mirror having a reflective surface and a hole having an edge. The hole extends through the reflective surface. The assembly includes a tubular body that extends through the hole. The tubular body has an inner surface and an outer surface. The tubular body is constructed and arranged to guide a main gas flow in a direction substantially transverse to the reflective surface. The assembly also includes an opening between the outer surface of the tubular body and the edge of the hole. The opening is arranged to guide a further gas flow that diverges with respect to the main gas flow. The outer surface of the tubular body and the edge of the hole may form the opening arranged to guide the further gas flow.

According to an aspect of the invention, there is provided a method for producing extreme ultraviolet radiation. The method includes directing a radiation beam, for example a laser beam, onto a droplet of an ignition material, the droplet being located at a predetermined target ignition position, so as to change the droplet into a plasma that is configured to produce an extreme ultraviolet radiation. The method includes reflecting the radiation using a collector mirror assembly, a module and/or a lithographic projection apparatus according to an aspect of the invention.

According to an aspect of the invention, there is provided a module constructed to produce extreme ultraviolet radiation. The module includes a supply configured to supply one or more droplets of an ignition material to a predetermined target ignition position, a radiation source configured to supply a laser beam arranged to be focused on the predetermined target ignition position and to produce a plasma by hitting a droplet located at the predetermined target ignition position so as to change the droplet into an extreme ultraviolet producing plasma, and a collector mirror assembly. The collector mirror assembly includes a collector mirror having a reflective surface and a hole having an edge. The hole extends through the reflective surface. The assembly includes a tubular body that extends through the hole. The tubular body has an inner surface and an outer surface. The tubular body is constructed and arranged to guide a main gas flow in a direction substantially transverse to the reflective surface. An opening is between the outer surface of the tubular body and the edge of the hole. The opening is arranged to guide a further gas flow that diverges with respect to the main gas flow. The outer surface of the tubular body and the edge of the hole may form the opening arranged to guide the further gas flow.

According to an aspect of the invention, there is provided a lithographic projection apparatus that includes a collector mirror assembly. The collector mirror assembly includes a collector mirror having a reflective surface configured to focus radiation emitted from a first focal point to a second focal point, and a hole having an edge. The hole extends through the reflective surface, and a tubular body extends through the hole. The tubular body has an inner surface and an outer surface. The tubular body is constructed and arranged to guide a main gas flow in a direction substantially transverse to the reflective surface. The apparatus also includes an opening between the outer surface of the tubular body and the edge of the hole. The opening is arranged to guide a further gas flow that diverges with respect to the main gas flow. The apparatus also includes a support configured to support a patterning device, the patterning device being configured to pattern the radiation after the radiation has passed through the second focal point to form a patterned beam of radiation, and a projection system configured to project the patterned beam of radiation onto a substrate. The outer surface of the tubular body and the edge of the hole may form the opening arranged to guide the further gas flow.

According to an aspect of the invention, there is provided a method for producing extreme ultraviolet radiation. The method includes directing a radiation beam onto a droplet of an ignition material, the droplet being located at a predetermined target ignition position, so as to change the droplet into a plasma that is configured to produce an extreme ultraviolet radiation, and reflecting the radiation and directing a gas flow toward the predetermined target ignition position using an collector mirror assembly. The assembly includes a collector mirror having a reflective surface and a hole having an edge. The hole extends through the reflective surface, and a tubular body extends through the hole. The tubular body includes an inner surface and an outer surface. The tubular body is constructed and arranged to guide a main gas flow in a direction substantially transverse to the reflective surface. An opening is between the outer surface of the tubular body and the edge of the hole. The opening is arranged to guide a further gas flow that diverges with respect to the gas main flow. The outer surface of the tubular body and the edge of the hole may form the opening arranged to guide the further gas flow.

One or more aspects of the invention may have, where appropriate, one or additional features described in relation to one or more other aspects of the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
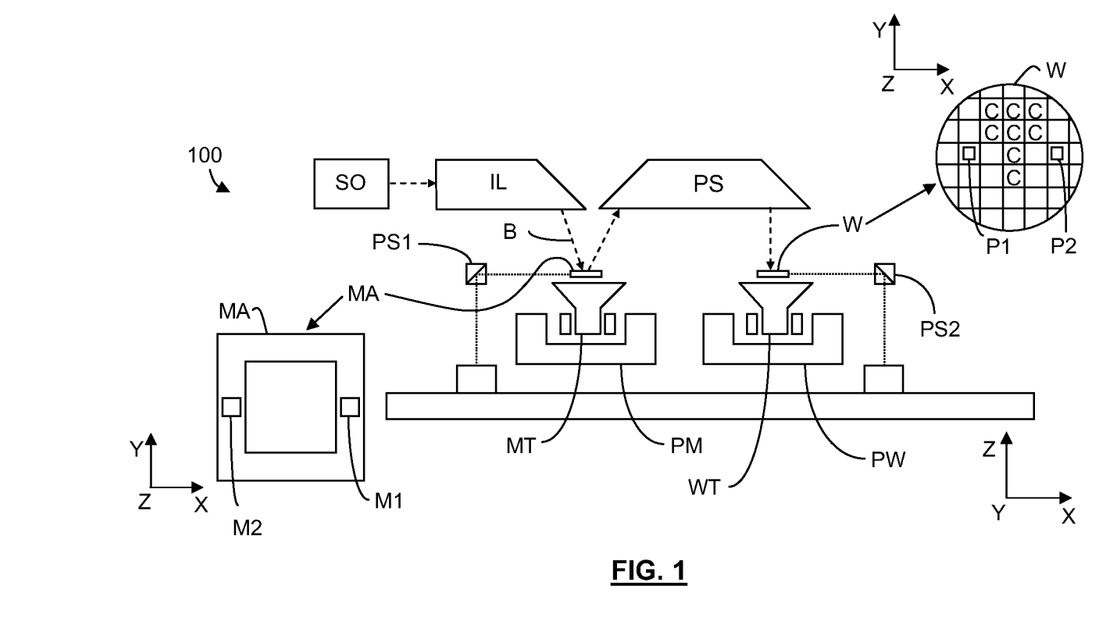
FIG. 1 depicts a lithographic apparatus according to an embodiment of the invention.

FIG. 1 schematically depicts a lithographic apparatus 100 including a source collector module SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
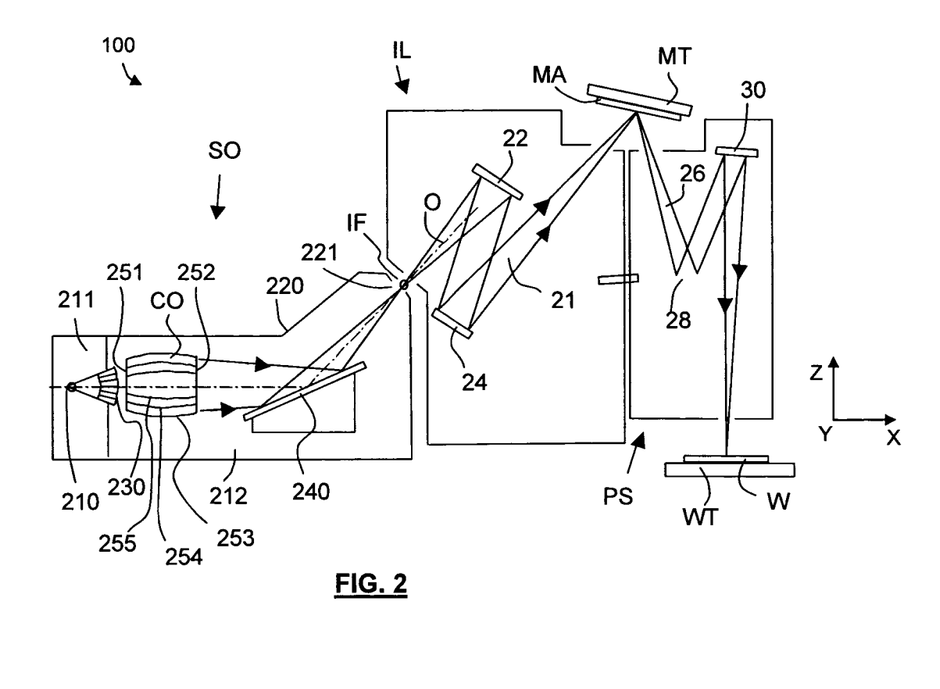
FIG. 2 is a more detailed example of a view of the apparatus of FIG. 1.

FIG. 2 shows an example of the lithographic apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
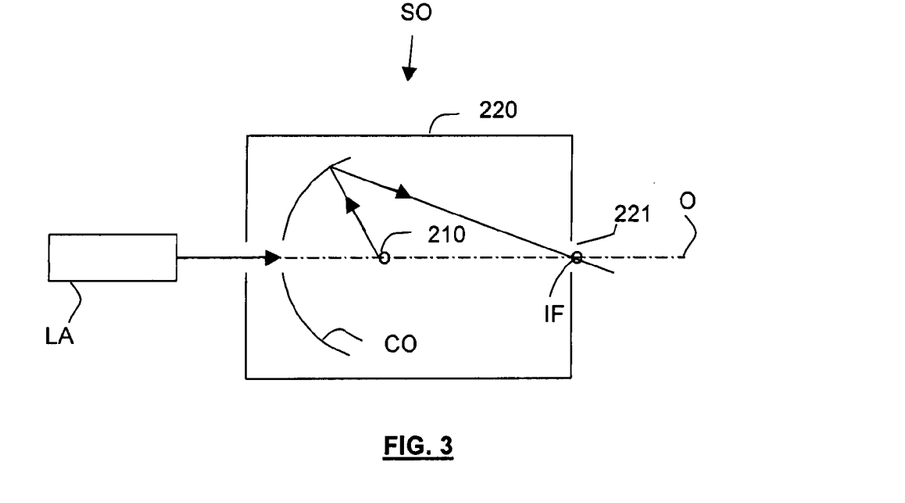
FIG. 3 is a more detailed view of an embodiment of a source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li) provided by a supply (not shown in the drawings), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

As previously discussed, in addition to extreme ultraviolet radiation, the plasma generally produces debris in the form of particles, such as thermalized atoms, ions, neutrals, nanoclusters, and/or microparticles. The debris may cause damage to the collector mirror and other optics. In an attempt to prevent the debris from causing damage, a buffer gas may be used in the vicinity of the plasma in order to mitigate the debris. In existing arrangements, the buffer gas might be directed through an aperture in the collector through which a laser beam may pass that is used in the creation of the plasma, and toward a focus point of the collector. However, this does not adequately prevent contamination reaching the collector surface away from the aperture. Alternatively or additionally, buffer gas may be directed from an outside edge of the collector toward that aperture, but this may drive contamination through the aperture and toward sensitive optical components. Thus, while these arrangements may reduce or suppress contamination, they may nevertheless be improved.

Figure 4:
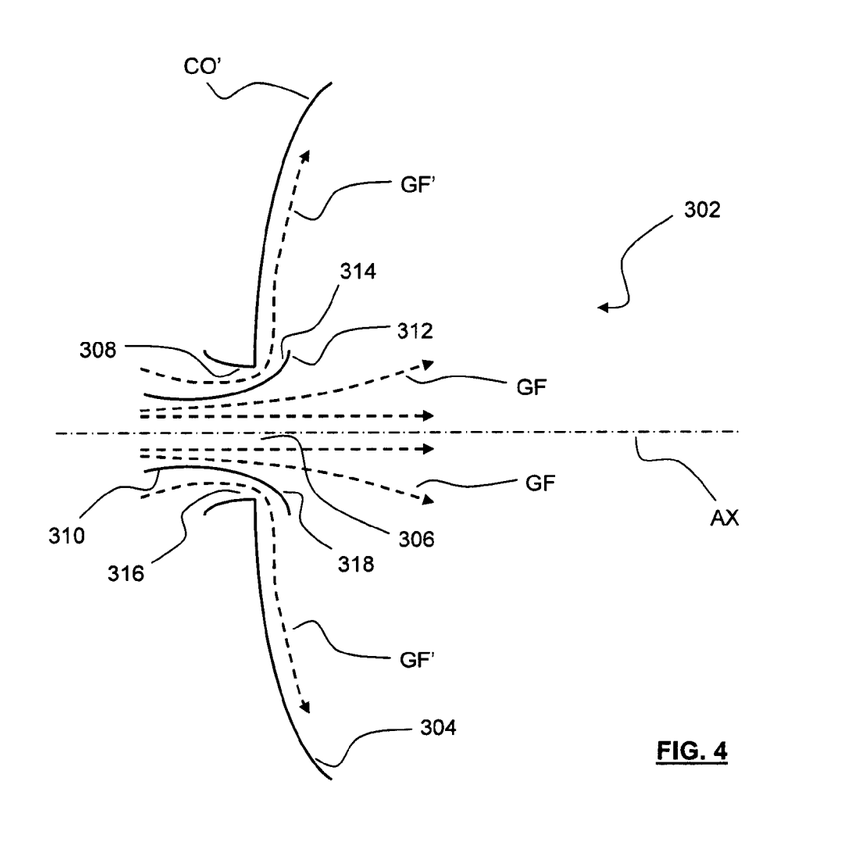
FIG. 4 schematically depicts an embodiment of an assembly that may be applied in the source collector module of FIG. 3.

FIG. 4 discloses a collector mirror assembly 302 which includes a collector optic, in this example a collector mirror CO'. The collector mirror CO' has a reflective surface 304. The reflective surface 304 of the collector mirror CO' is constructed to focus radiation emitted from a first focal point to a second focal point. The collector mirror is a normal incidence collector.

The collector mirror assembly 302 may be included in a source collector module SO similar to the one depicted in FIG. 3. The first focal point may coincide with the location at which the radiation-emitting plasma 210 may be generated. This location is also referred to as the predetermined target ignition position. As a consequence of the fact that the radiation-emitting plasma 210 is generated at the first focal point, the virtual source point IF coincides with the second focal point.

Typically, but not necessarily, the collector mirror may be a multi-layer mirror. Such a multi-layer mirror may include alternating layers of Mo and Si. Anti-diffusion layers may be provided in order to prevent diffusion between the Mo layers and the Si layers. A suitable material for such an anti-diffusion layer is $B_4C$.

The collector mirror CO' also includes a hole 306 (FIG. 4) which extends through the reflective surface 304 of the collector mirror CO'. The hole 306 is located on an axisymmetric line AX of the collector CO'. The hole 306 has an edge 308. The assembly 302 is provided with a tubular body 310, which extends through the hole 306. The tubular body 310 has an inner surface 312 and an outer surface 314.

The word 'tubular' will be understood by the skilled person as a broad term, which may encompass or be synonymous with a variety of different structures. For example, a tubular body may not have parallel walls, but could instead be conical or flared. The tubular body may be any structure that forms a conduit from one side of the collector (e.g. a non-collecting surface) to another, opposite side of the collector (e.g. a collecting surface). The tubular body might have a circular cross-section, or an elliptical cross-section, or any other suitable cross-section.

In use, a main gas flow GF is directed through the tubular body 310 which, in this embodiment, is constructed and arranged to guide the gas flow GF in a direction transverse to the reflective surface 304. For example, the inner surface 312 of the tubular body 310 is constructed and arranged to guide the gas flow GF in a direction transverse to the reflective surface 304. Typically, the gas flow GF is directed toward one or both of the first focal point and the second focal point. An opening 316 may be located between the outer surface 314 of the tubular body 310 and the edge 308 of the hole 306. In the embodiment of FIG. 4, the outer surface 314 and the edge 308 form or define the opening 316. The opening 316 (which includes one or more structures forming at least a part of that opening 316, e.g. the outer surface 314 of the tubular body 310 and the edge 308) is arranged to guide a further gas flow GF' that diverges with respect to the gas flow GF. A divergent gas flow is advantageous, as contamination over a wider area may be suppressed, and also may drive contamination away from the tubular body 310, and/or opening 316 and/or the reflective surface 304 of the collector CO'. For instance, the opening 316, for example the outer surface 314 of the tubular body 310 forming a part of that opening 316, may be shaped to guide the further gas flow GF' substantially along the reflective surface 304, and away from the tubular body 310. This may be advantageous, because contamination may be driven away from the tubular body 310, and/or opening 316 and/or the reflective surface 304 of the collector CO'. In contrast, in a known arrangement, buffer gas may flow in substantially opposite direction, from an outside edge of the collector and toward an opening in the collector. This may increase the risk of contamination being driven through the aperture, and toward sensitive optical components or the like that may be used to condition a laser beam used in the formation of the plasma. This is undesirable.

In the embodiment of FIG. 4, part 318 of the inner surface 312 and the outer surface 314 of the tubular body 310 are tapered in a direction substantially opposite the gas flow GF to induce the previously mentioned divergence.

Because the hole 306 is typically used to transmit the laser energy from a laser, proper arrangement of the tubular body 310 may limit any potential impairment of the imaging ability of the reflective surface 304 of the collector mirror CO'. For example, the tubular body 310 may be located in a shadow region, where collection of radiation is not possible, or in a region where collection is not required.

Figure 5:
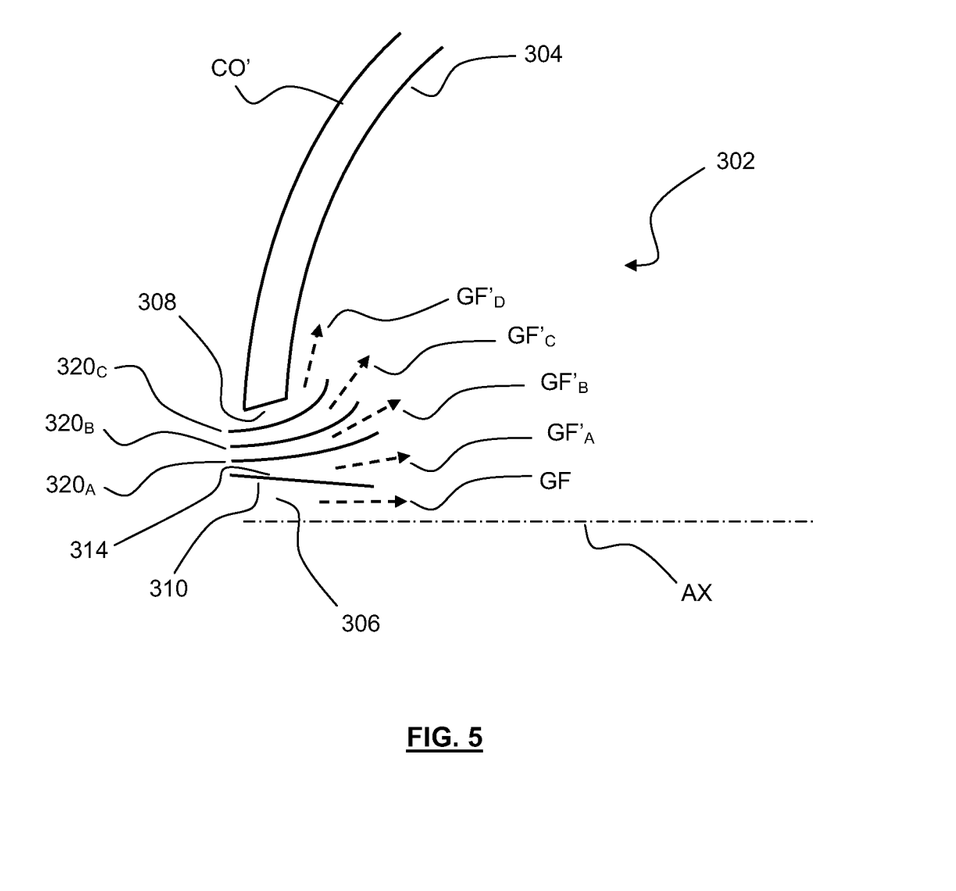
FIG. 5 schematically depicts an embodiment of the assembly of FIG. 4.

One or more walls can be provided between the outer surface 314 of the tubular body 310 and the edge of the hole 306. In order to illustrate this, FIG. 5 schematically depicts a modification of the assembly 302 of FIG. 4. Because the assembly is symmetrical around the axisymmetric line AX indicated in FIG. 5, only part of the assembly is actually shown. As can be seen in FIG. 5, three walls $320_A$, $320_B$ and $320_C$ are provided between the outer surface 314 of the tubular body 310 and the edge 308 of the hole 306. These walls $320_A$, $320_B$ and $320_C$ divide the further gas flow in one or more sub-flows $GF'_A$, $GF'_B$, $GF'_C$ and $GF'_D$. The division into such sub-flows adds to the laminarity of the flow GF and the sub-flows $GF'_A$, $GF'_B$, $GF'_C$ and $GF'_D$. Laminarity of these flows is desirable, because laminar flows are generally better controllable than non-laminar, i.e. turbulent flows. The introduction of one or more walls $320_A$, $320_B$ and $320_C$ may alternatively or additionally add to the degree of control of the gas flow as a whole, and/or to the direction of specific components of that gas flow. The one or more walls $320_A$, $320_B$ and $320_C$ may form at least a part of further tubular bodies that surround the tubular body 310 already described.

It will be appreciated that the assemblies shown in FIGS. 4 and 5 are depicted as sections through the collector assembly. Although gas flow is shown as being in the plane in which the Figures are provided, it will be appreciated that the gas flow will or may also be distributed, or uniformly distributed, around the axisymmetric line, e.g. in a circumferential direction about the axisymmetric. In this manner, the entire collector surface may be protected by the gas flow.

The one or more tubular bodies or openings described above may comprise a narrowing or restriction, thus forming a venturi. The narrowing or restriction may cause the flow of gas to be accelerated in the region of the venturi, which may be advantageous. The opening or openings, which include structures forming or defining those openings, and/or the tubular body may be defined as or form one or more nozzles. A nozzle may comprise a restriction, as previously described.

The gas passing through the opening in the collector and/or the tubular body will usually be the same gas, supplied by the same source. The flow of gas may be, for example, between 50 and 250 (normal) liters per minute. The gas may be hydrogen (atomic or molecular), deuterium, helium and/or argon.

The opening, which includes walls defining that opening (or further openings), and/or the central tubular body may be arranged to ensure that a specific split of the gas flow is obtained, the split being between gas passing through the central tubular body and the surrounding opening or openings. For example, the split may result in 80% of the gas flowing through the central tubular body, and 20% through a surrounding opening or through surrounding openings. In another example, the split may result in 20% of the gas flowing through the central tubular body, and 80% through a surrounding opening or through surrounding openings. In another example, the split could be anywhere between the previous two examples, for instance the split may result in 50% of the gas flowing through the central tubular body, and 50% through a surrounding opening or through surrounding openings. The split may be configured to ensure that gas flow along the collector surface is not drawn towards gas flow transverse to the surface, and/or the split may be configured to ensure that gas flow transverse to the collector surface is not drawn towards gas flow along the collector surface. Such a split, or a balance between such splits, might ensure that gas is properly directed at a focus of the collector, and along a surface of the collector. The exact values of the split will vary depending on gas flow rates and the dimensions of the collector assembly and the like, and may for example be determined from trial and error or routine modeling. The values of the split may alternatively or additionally be dependent on operational conditions, for example at what duty cycle the source operates. For example, at a high duty cycle (e.g. full power) the flow through the central tubular body might be 80%, and 20% through the surrounding opening or through surrounding openings. When the source is at low duty cycle or at stand-by the split might be reversed—20% through the central tubular body, and 80% through the surrounding opening or through surrounding openings.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A collector mirror assembly comprising:
   a collector mirror having a reflective surface and a hole having an edge, the hole extending through the reflective surface;
   a tubular body that extends through the hole, the tubular body having an inner surface and an outer surface, the tubular body constructed and arranged to guide a main gas flow in a direction substantially transverse to the reflective surface; and
   an opening between the outer surface of the tubular body and the edge of the hole, the opening arranged to guide a further gas flow that diverges with respect to the main gas flow, wherein the opening is arranged to guide the further gas flow substantially along the reflective surface.

2. The assembly according to claim 1, wherein at least part of one or both of the inner surface and the outer surface of the tubular body are tapered in a direction against the main gas flow.

3. The assembly according to claim 1, wherein one or more walls are provided between the outer surface of the tubular body and the edge of the hole, the one or more walls being constructed and arranged to divide the further gas flow in one or more sub-flows.

4. The assembly according to claim 1, wherein the collector mirror is constructed to focus radiation emitted from a first focal point to a second focal point, wherein the main gas flow is directed away from the reflective surface to one or both of the first focal point and the second focal point.

5. The assembly according to claim 1, wherein the opening is formed by the outer surface of the tubular body and the edge of the hole.

6. The assembly according to claim 1, wherein the opening is arranged to guide the further gas flow away from the tubular body.

7. A module constructed to produce extreme ultraviolet radiation, the module comprising:
   a supply configured to supply one or more droplets of an ignition material to a predetermined target ignition position;
   a radiation source configured to supply a laser beam arranged to be focused on the predetermined target ignition position and to produce a plasma by hitting a droplet located at the predetermined target ignition position so as to change the droplet into an extreme ultraviolet producing plasma; and a collector mirror assembly, comprising
  a collector mirror having a reflective surface and a hole having an edge, the hole extending through the reflective surface;
  a tubular body that extends through the hole, the tubular body having an inner surface and an outer surface, the tubular body constructed and arranged to guide a main gas flow in a direction substantially transverse to the reflective surface; and an opening between the outer surface of the tubular body and the edge of the hole, the opening arranged to guide a further gas flow that diverges with respect to the main gas flow, wherein the opening is arranged to guide the further gas flow substantially along the reflective surface.

8. The module according to claim 7, wherein the collector mirror is constructed to focus radiation emitted from a first focal point to a second focal point, wherein the main gas flow is directed away from the reflective surface to one or both of the first focal point and the second focal point, the target ignition position being the first focal point.

9. The module according to claim 7, wherein the opening is formed by the outer surface of the tubular body and the edge of the hole, the target ignition position being the first focal point, the target ignition position being the first focal point.

10. The module according to claim 7, wherein the opening is arranged to guide the further gas flow away from the tubular body.

11. A lithographic projection apparatus comprising:
a collector mirror assembly, comprising:
  a collector mirror having a reflective surface configured to focus radiation emitted from a first focal point to a second focal point, and a hole having an edge, the hole extending through the reflective surface,
  a tubular body having an inner surface and an outer surface, the tubular body constructed and arranged to guide a main gas flow in a direction substantially transverse to the reflective surface, and
  an opening between the outer surface of the tubular body and the edge of the hole, the opening arranged to guide a further gas flow that diverges with respect to the main gas flow, wherein the opening is arranged to guide the further gas flow substantially along the reflective surface;
a support configured to support a patterning device, the patterning device being configured to pattern the radiation after the radiation has passed through the second focal point to form a patterned beam of radiation; and
a projection system configured to project the patterned beam of radiation onto a substrate.

12. The lithographic projection apparatus according to claim 11, wherein the opening is arranged to guide the further gas flow away from the tubular body.

13. A method for producing extreme ultraviolet radiation, comprising:
directing a radiation beam, such as a laser beam, onto a droplet of an ignition material, the droplet being located at a predetermined target ignition position, so as to change the droplet into a plasma that is configured to produce an extreme ultraviolet radiation;
reflecting the radiation and directing a gas flow toward the predetermined target ignition position using an collector mirror assembly, the assembly comprising:
  a collector mirror having a reflective surface and a hole having an edge, the hole extending through the reflective surface,
  a tubular body having an inner surface and an outer surface, the tubular body constructed and arranged to guide a main gas flow in a direction substantially transverse to the reflective surface, and
  an opening between the outer surface of the tubular body and the edge of the hole, the opening arranged to guide a further gas flow that diverges with respect to the main gas flow, wherein the opening is arranged to guide the further gas flow substantially along the reflective surface.

14. The method according to claim 13, wherein the collector mirror is constructed to focus radiation emitted from a first focal point to a second focal point.

15. The method according to claim 14, wherein the method comprises:
providing the main gas flow through the tubular body and/or the further gas flow through the opening, the main gas flow being directed towards one or both of the first and second focal point.

16. The method according to claim 13, wherein the opening is arranged to guide the further gas flow away from the tubular body.

* * * * *